(12) United States Patent
Davidson et al.

(10) Patent No.: US 8,614,414 B2
(45) Date of Patent: Dec. 24, 2013

(54) PROXIMITY SENSOR

(75) Inventors: Kyle Robert Davidson, Noblesville, IN (US); Matthew E. M. Storkey, Cambridge (GB); Timothy J. Ensor, Cambridge (GB); Timothy John Thorn, North Weald (GB); Paul D. Koottungal, Leander, TX (US)

(73) Assignee: Masco Corporation of Indiana, Indianapolis, IN (US)

( * ) Notice: Subject to any disclaimer, the term of this patent is extended or adjusted under 35 U.S.C. 154(b) by 500 days.

(21) Appl. No.: 12/648,572

(22) Filed: Dec. 29, 2009

(65) Prior Publication Data

US 2011/0155894 A1 Jun. 30, 2011

(51) Int. Cl.
*G06M 7/00* (2006.01)
*H01J 40/14* (2006.01)

(52) U.S. Cl.
USPC ...... 250/221; 250/222.1; 250/239; 250/208.2

(58) Field of Classification Search
USPC ....... 250/221, 222.1, 237 G, 239, 216, 208.1, 250/208.2
See application file for complete search history.

(56) References Cited

U.S. PATENT DOCUMENTS

| | | | |
|---|---|---|---|
| 4,867,570 A * | 9/1989 | Sorimachi et al. | 356/603 |
| 5,549,273 A | 8/1996 | Aharon | |
| 5,610,719 A | 3/1997 | Allen | |
| 6,492,634 B2 * | 12/2002 | Marchitto et al. | 250/221 |
| 6,598,245 B2 | 7/2003 | Nishioka | |
| 6,671,890 B2 | 1/2004 | Nishioka | |
| 6,962,168 B2 | 11/2005 | McDaniel | |
| 7,138,620 B2 | 11/2006 | Trisnadi | |
| 7,150,293 B2 | 12/2006 | Jonte | |
| 7,205,527 B2 | 4/2007 | Li et al. | |
| 7,232,111 B2 | 6/2007 | McDaniel et al. | |
| 7,278,624 B2 | 10/2007 | Iott | |
| 7,472,433 B2 | 1/2009 | Rodenbeck | |
| 7,516,939 B2 | 4/2009 | Bailey | |
| 7,537,195 B2 | 5/2009 | McDaniel | |
| 7,614,096 B2 | 11/2009 | Vincent | |
| 7,651,068 B2 | 1/2010 | Bailey | |
| 8,100,540 B2 * | 1/2012 | Huebner | 353/94 |
| 8,355,822 B2 * | 1/2013 | Jonte et al. | 700/282 |
| 2002/0030154 A1 * | 3/2002 | Marchitto et al. | 250/221 |
| 2003/0075675 A1 * | 4/2003 | Braune et al. | 250/221 |
| 2003/0094566 A1 * | 5/2003 | Hamalainen et al. | 250/221 |
| 2003/0218746 A1 | 11/2003 | Sampas | |
| 2005/0035277 A1 * | 2/2005 | Matsuyama et al. | 250/221 |

(Continued)

FOREIGN PATENT DOCUMENTS

| | | |
|---|---|---|
| WO | WO 2006/115766 | 11/2006 |
| WO | WO 2007/059051 | 5/2007 |

OTHER PUBLICATIONS

Welch, Sharon, "Effects of Window Size and Shape on Accuracy of Subpixel Centroid Estimation of Target Images", NASA Technical Paper 3331, Sep. 1993.
CMOS linear image sensor S10226, Hamamatsu, (2008), 5 pages.

(Continued)

*Primary Examiner* — John Lee
(74) *Attorney, Agent, or Firm* — Faegre Baker Daniels LLP

(57) ABSTRACT

A proximity sensor is disclosed. The proximity sensor may be incorporated as part of a water delivery device. A holder which aligns an optical source and sensor of the proximity sensor is disclosed.

22 Claims, 13 Drawing Sheets

(56) References Cited

U.S. PATENT DOCUMENTS

| | | |
|---|---|---|
| 2005/0084156 A1 | 4/2005 | Das et al. |
| 2005/0150556 A1 | 7/2005 | Jonte |
| 2005/0151101 A1 | 7/2005 | McDaniel et al. |
| 2005/0205818 A1 | 9/2005 | Bayley |
| 2005/0207943 A1 | 9/2005 | Puzey |
| 2005/0211882 A1* | 9/2005 | Ohtomo et al. .............. 250/221 |
| 2006/0044546 A1* | 3/2006 | Lewin et al. ................ 356/4.04 |
| 2006/0124883 A1 | 6/2006 | Bailey |
| 2006/0130907 A1 | 6/2006 | Marty |
| 2006/0200903 A1 | 9/2006 | Rodenbeck et al. |
| 2006/0207019 A1 | 9/2006 | Vincent |
| 2006/0231782 A1 | 10/2006 | Iott |
| 2007/0057166 A1* | 3/2007 | Kuo et al. .................... 250/221 |
| 2007/0069168 A1 | 3/2007 | Jonte |
| 2007/0090279 A1* | 4/2007 | Venkatesh .................. 250/221 |
| 2007/0156260 A1 | 7/2007 | Rodenbeck et al. |
| 2007/0157978 A1 | 7/2007 | Jonte et al. |
| 2007/0241262 A1 | 10/2007 | Wang |
| 2007/0246267 A1 | 10/2007 | Koottungal |
| 2007/0246550 A1 | 10/2007 | Rodenbeck |
| 2007/0246564 A1 | 10/2007 | Rodenbeck |
| 2008/0061219 A1* | 3/2008 | Lee et al. ..................... 250/221 |
| 2009/0039176 A1 | 2/2009 | Davidson |
| 2009/0267918 A1* | 10/2009 | Lu et al. ...................... 345/175 |
| 2009/0289177 A1* | 11/2009 | Yao et al. ..................... 250/221 |
| 2010/0092047 A1* | 4/2010 | Yamamoto et al. .......... 382/124 |
| 2010/0108165 A1 | 5/2010 | Rodenbeck |
| 2011/0114828 A1* | 5/2011 | Matsubara ................... 250/221 |
| 2011/0133941 A1* | 6/2011 | Yao et al. ..................... 340/600 |
| 2011/0147102 A1* | 6/2011 | Song et al. ................. 178/18.09 |
| 2011/0155251 A1* | 6/2011 | Jonte et al. ....................... 137/1 |
| 2011/0155894 A1* | 6/2011 | Davidson et al. .......... 250/208.2 |
| 2011/0155932 A1* | 6/2011 | Jonte et al. ............... 251/129.01 |

OTHER PUBLICATIONS

CMOS linear image sensor S10226, Hamamatsu, (2008), 5 pages, (Oct. 2008).

* cited by examiner

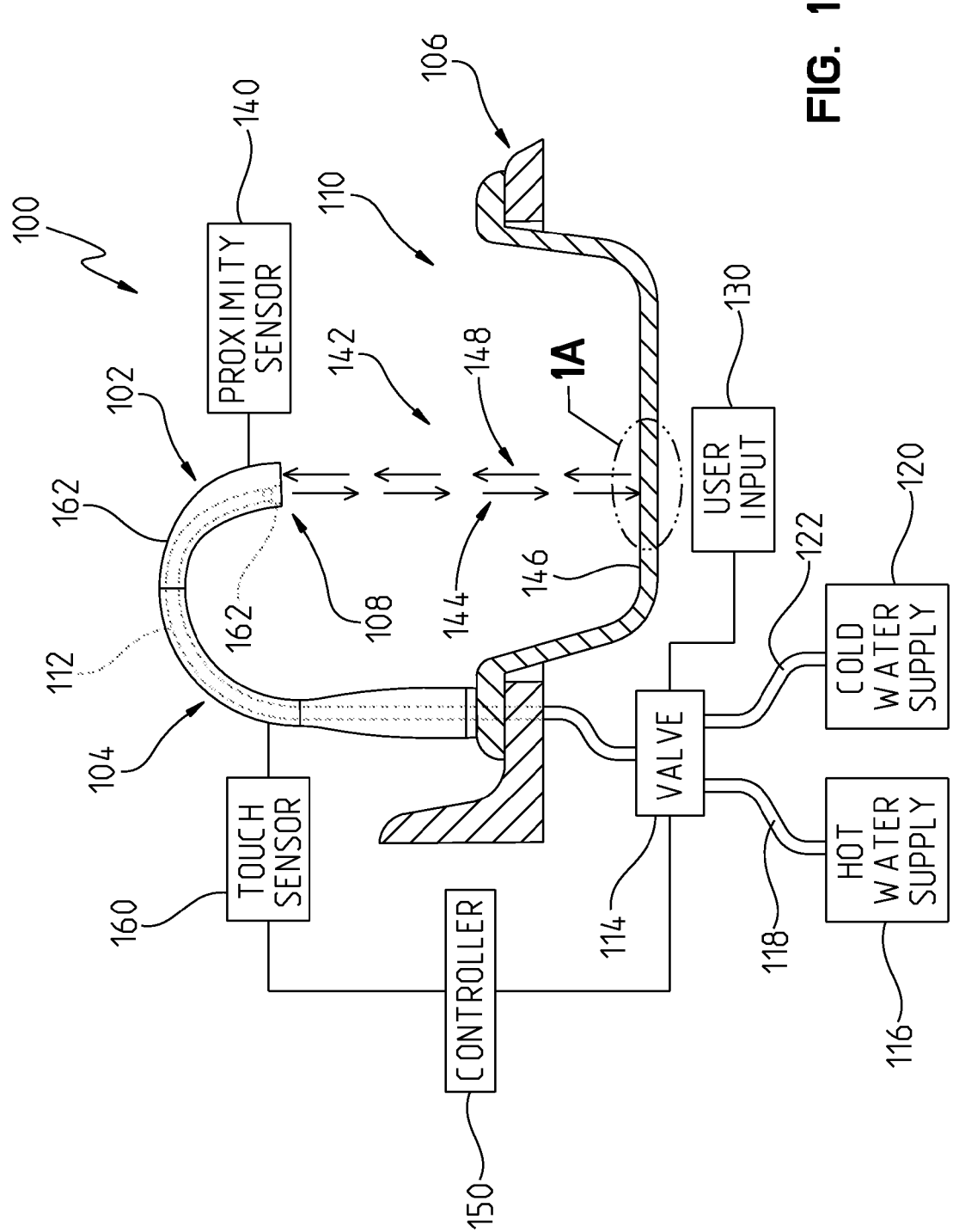

ILLUMINATION PATTERN

VARIATION OF CORRELATION RESULT WITH PIXEL INDEX

PROXIMITY SENSOR

BACKGROUND AND SUMMARY

The present disclosure relates to proximity sensors. More specifically, the present disclosure relates to water delivery devices including proximity sensors.

Water delivery devices are known that include proximity sensors. One example proximity sensor is a position sensing detector (PSD) sensor which provides range information based on an angle of reflection from an infrared (IR) emitter to an analog detector. This sensor arrangement works well for sensing objects that produce diffuse return signals such as hands or plastic objects, but have difficulty with highly polished or smooth object such as metal or glass. Water can also affect distance reading accuracy.

Two primary issues with the sensing of shiny object or objects in water is that the distance reading have significant error or there is a large percentage of noise/instability in the readings. The main cause for instability in the range readings provided by a PSD sensor is its inherent averaging of the received signal. The range is determined by the position along the length of the sensor which receives the highest intensity of the transmitted IR light. In normal operation this will be at one extreme end for light reflected from a close object, and the other extreme end for light reflected from a distant object. In the case of a sink, features on a base of a shiny sink, or ripples in the water can cause additional, spurious reflections of the transmitted light. These spurious reflections are averaged with the desired signal and cause the PSD to produce an unreliable and unstable output.

In an exemplary embodiment of the present disclosure, a proximity sensor for sensing the presence of an object in an environment is disclosed. The proximity sensor comprising an illumination module which emits optical energy that is propagated into the environment in a plurality of spatially spaced apart beams of optical energy; a multi-element sensor which receives a portion of the emitted optical energy which is reflected back from the environment; and a holder which aligns the multi-element sensor relative to at least a first portion of the illumination module, the holder having a first portion which holds the first portion of the illumination module in a first position and a second portion which holds the multi-element sensor in a second position spaced apart from the first position. A face of the multi-element sensor being angled relative to a plane which is normal to an optical axis of the illumination module. The proximity sensor further including a controller coupled to the illumination module and the multi-element sensor; and a housing which supports the illumination module, the multi-element sensor, and the holder.

In one example, a second portion of the illumination module is spaced apart from the holder.

In another example, the first portion of the illumination module includes a first optical source which emits optical energy in a first direction along the optical axis of the illumination module and which is supported by the holder and the second portion of the illumination module includes an optical system which splits the optical energy emitted by the first optical source in the first direction into the plurality of spatially spaced apart beams of optical energy. In a variation thereof, the optical system includes a diffraction grating which splits the optical energy emitted by the first optical source in the first direction along the optical axis of the illumination module into the plurality of spatially spaced apart beams of optical energy. In a further variation thereof, the diffraction grating includes a plurality of regions having distinct grating frequencies. A first region having a first grating frequency which splits the optical energy emitted by the first optical source in the first direction along the optical axis of the illumination module into a first beam which propagates in the first direction along the optical axis of the illumination module and at least two additional beams spaced apart from the first beam and a second grating frequency which splits the optical energy emitted by the first optical source in the first direction along the optical axis of the illumination module into the first beam which propagates in the first direction along the optical axis of the illumination module and at least two additional beams spaced apart from the first beam and spaced apart from the at least two additional beams corresponding to the first grating frequency. In another variation, the optical system includes a lens positioned between the first optical source and the diffraction grating.

In still another example, the plurality of spatially spaced apart beams of optical energy are an odd number and a central beam of the plurality of discrete beams has an intensity of about twice the remainder of the plurality of spatially spaced apart beams of optical energy. In a variation thereof, the central beam of the plurality of spatially spaced apart beams of optical energy propagates generally in a first direction along the optical axis of the illumination module.

In yet another example, the first portion of the holder includes a first alignment surface with contacts the first portion of the illumination module and the second portion of the holder includes a second alignment surface which contacts the multi-element sensor. The second alignment surface being angled relative to the first alignment surface.

In still a further example, the illumination module includes a first plurality of prongs which couple the illumination module to the controller and the multi-element sensor includes a second plurality of prongs which couple the multi-element sensor to the controller. The illumination module and the multi-element sensor are positioned on a first side of the holder and the controller is positioned on a second side of the holder. The first plurality of prongs and the second plurality of prongs extending through the holder.

In another exemplary embodiment of the present disclosure, a proximity sensor for sensing the presence of an object in an environment is provided. The proximity sensor comprising a housing having a first plurality of alignment features; a holder having a second plurality of alignment features which cooperate with the first plurality of alignment features to secure the holder to the housing; an optical source positioned on a first side of the holder; a multi-element sensor positioned on the first side of the holder and spaced apart from the optical source; a controller positioned on a second side of the holder opposite of the first side, the controller being coupled to the optical source and the multi-element sensor through the holder; a first optical system supported by the housing and aligned with the optical source; and a second optical system supported by the housing and aligned with the multi-element sensor. The first optical system being spaced apart from the optical source and the second optical system being spaced apart from the first optical system and from the multi-element sensor.

In one example, the housing includes an exit window through which optical energy emitted by the optical source that passes through the first optical system exits the housing and an entrance window through which optical energy reflected by the object enters the housing and passes through the second optical system and onto the multi-element sensor. In a variation thereof, the first optical system splits the optical energy emitted by the optical source into a plurality of spatially spaced apart beams of optical energy. In a further variation thereof, the first optical system includes a lens and a diffraction grating and the second optical system includes a lens, the housing including a first recess which receives the first optical system and a second recess spaced apart from the first recess which receives the second optical system. In yet a further variation thereof, the housing orients the diffraction grating such that the plurality of spatially spaced apart beams of optical energy are incident on the multi-element sensor when reflected by the object in the environment. In still another variation thereof, the second recess supports an optical window for the exit window.

In another example, at least one of the first optical system and the second optical system includes an anti-fog coating.

In yet another exemplary embodiment of the present disclosure, a proximity sensor for sensing the presence of an object in an environment is provided. The proximity sensor comprising an illumination module which emits optical energy that is propagated into the environment in a plurality of spatially spaced apart beams of optical energy. The illumination module including a first optical source and a diffraction grating which splits optical energy from the first optical source into the plurality of spatially spaced apart beams of optical energy. The proximity sensor further comprising a multi-element sensor which receives a portion of the emitted optical energy which is reflected back from the environment, the received portion having a plurality of spaced apart peaks; a controller coupled to the illumination module and the multi-element sensor; and a housing which supports the illumination module, the multi-element sensor, and the holder.

In one example, proximity sensor further comprises a holder which aligns the multi-element sensor relative to at least a first portion of the illumination module. In a variation thereof, the holder includes a first portion which holds the first portion of the illumination module in a first position and a second portion which holds the multi-element sensor in a second position spaced apart from the first position. A face of the multi-element sensor being angled relative to a plane which is normal to an optical axis of the illumination module.

In still another exemplary embodiment of the present disclosure, a method of controlling a valve having a first arrangement wherein fluid is provided from an inlet of the valve to an outlet of the valve and a second arrangement wherein fluid is not provided from the inlet of the valve to the outlet of the valve is provided. The method comprising the steps of emitting a plurality of spatially spaced apart beams of optical energy into a detection zone; receiving through a multi-element sensor optical energy reflected from the detection zone; determining a presence of an object in the detection zone based in part on the received optical energy and at least one characteristic of the plurality of spatially spaced apart beams of optical energy; and automatically configuring the valve in the first arrangement when it is determined that the object is present.

In one example, the received optical energy includes a plurality of spaced apart peaks. In a variation thereof, the valve is in fluid communication with a fluid conduit which directs the fluid into the detection zone.

In another example, the step of determining the presence of the object in the detection zone includes the steps of determining a location of the object in the detection zone; and determining a confidence level for the object. In a variation thereof, the method further comprising the step of establishing a baseline position based on the optical energy received from the detection zone. In a further variation thereof, the step of automatically configuring the valve in the first arrangement is performed when the location of the object in the detection zone is less than the baseline position and the confidence level exceeds a threshold value. In yet another variation thereof, the step of determining the location of the object in the detection zone includes the steps of correlating the received optical energy with a comb function to produce a correlated result; and selecting a pixel in the correlated result which has the highest intensity, the pixel representing the location of the object in the detection zone. In still a further variation thereof, the step of determining a confidence level for the object includes the steps of correlating the received optical energy with a comb function to produce a correlated result; identifying a first pixel in the correlated result which has the corresponding highest peak intensity of the correlated result; identifying a second pixel in the correlated result which has the corresponding second highest peak intensity of the correlated result; and classify the object based on at least one of a first comparison of the intensity values of the first pixel and the second pixel and a second comparison of a separation of the first pixel and the second pixel. In a further variation thereof, the object is classified based on both the first comparison of the intensity values of the first pixel and the second pixel and the second comparison of the separation of the first pixel and the second pixel. In still another variation, the first comparison of the intensity values includes the steps of: computing an intensity difference of an intensity value of the first pixel and an intensity value of the second pixel; and comparing the intensity difference to a threshold value. in yet still another variation, the second comparison of the separation of the first pixel and the second pixel includes the steps of: computing a pixel difference of the first pixel and the second pixel; and comparing the pixel difference to an expected pixel separation.

In yet a further exemplary embodiment, method of controlling a valve having a first arrangement wherein fluid is provided from an inlet of the valve to an outlet of the valve and a second arrangement wherein fluid is not provided from the inlet of the valve to the outlet of the valve is provided. The method comprising the steps of establishing a baseline position for a detection zone; emitting a plurality of spatially spaced apart beams of optical energy into the detection zone; receiving with a sensor optical energy reflected from the detection zone; determining a presence of an object in the detection zone based in part on the received optical energy and at least one characteristic of the plurality of spatially spaced apart beams of optical energy; and automatically configuring the valve in the first arrangement when it is determined that the object is present and located at a position less than the baseline position.

In one example, method further comprises the step of automatically configuring the valve in the second arrangement when the object is no longer present.

In another example, method further comprises the step of automatically configuring the valve in the second arrangement when the object is no longer present at the position less than the baseline position.

In still another example, method further comprises the step of automatically configuring the valve in the second arrangement in response to an input from a touch sensor. In a variation thereof, the method further comprises the step of establishing a new baseline position based on the position of the object in response to the input from the touch sensor. In another variation thereof, a spout includes a fluid conduit that is in fluid communication with the valve, the spout supporting a proximity sensor which emits the plurality of spatially spaced apart beams of optical energy and at least a portion of an exterior of the spout is part of the touch sensor. In still another variation thereof, the fluid is water. In yet another variation thereof, the method further comprises the steps of placing a supply of hot water in fluid communication with the valve; placing a supply of cold water in fluid communication with the valve; and regulating at least a temperature of the fluid provided by the outlet of the valve based on at least one user input.

In still another exemplary embodiment of the present disclosure, a water delivery system which is coupled to a source of water is provided. The water delivery system comprising a valve including an inlet in fluid communication with the source of water and an outlet, the valve having a first arrangement wherein the outlet of the valve is in fluid communication with the inlet of the valve and a second arrangement wherein the outlet of the valve is not in fluid communication with the inlet of the valve; a fluid conduit in fluid communication with the outlet of the valve to receive water from the valve when the valve is in the first arrangement; an illumination module which emits optical energy into a detection zone in a plurality of spatially spaced apart beams of optical energy; a multi-element sensor which receives optical energy reflected from an object positioned in the detection zone, the received optical energy having a plurality of spatially spaced apart peaks; and a controller which causes the valve to move from the second arrangement to the first arrangement based on at least one of a spacing between at least two of the plurality of spatially spaced apart peaks of the received optical energy and an intensity of at least two of the plurality of spaced apart peaks.

In one example, the illumination module includes an optical source which outputs a directional beam of optical energy in a first direction and an optical system which splits the directional beam of optical energy into the plurality of spatially spaced apart beams of optical energy. In a variation thereof, the optical system includes a grating which splits the directional beam of optical energy into the plurality of spatially spaced apart beams of optical energy. In another variation, the optical system includes a lens interposed between the optical source and the grating.

In another example, the multi-element sensor is a single row sensor having a plurality of pixels. In a further example, the water delivery system further comprises a spout. The fluid conduit being positioned within the spout. In a variation thereof, the illumination module and the multi-element sensor are supported by the spout. In a further variation thereof, the water delivery system further comprises a spray head coupled to the fluid conduit and positioned to provide water from an end surface of the spout. In yet another variation, the spout includes a window through which the illumination module emits optical energy into the detection zone in a plurality of spatially spaced apart beams of optical energy. In still another variation, the optical energy received from the detection zone reaches the multi-element sensor through the window. In yet still another variation, at least a portion of the spout is part of a touch sensor coupled to the controller to provide an input to controller to change the arrangement of the valve. In a further variation, the controller establishes a baseline position based on the optical energy received from the detection zone by the multi-element sensor. In still a further variation, the controller moves the valve to the first arrangement when the controller detects an object at a distance less than the baseline position based on the optical energy received from the detection zone by the multi-element sensor. In yet still a further variation, the controller moves the valve to the second arrangement when the controller no longer detects the object at the distance less than the baseline position. In still yet another variation, the controller moves the valve to the second arrangement when the controller receives an input from the touch sensor to change the arrangement of the valve. In still another variation, the controller establishes a new baseline position based on a distance to an object being detected subsequent to the input from the touch sensor, the new baseline position being less than the baseline position. In yet still another variation, the controller detects the object based on at least one of the spacing between at least two of the plurality of spatially spaced apart peaks of the received optical energy and the intensity of at least two of the plurality of spaced apart peaks of the received optical energy. In still a further variation, the distance of the object is determined based on which pixel of the multi-element sensor has the highest intensity value when the received optical energy is correlated with a comb function.

In another exemplary embodiment of the present disclosure, a water delivery system which is coupled to a source of water is provided. The water delivery system comprising a valve including an inlet in fluid communication with the source of water and an outlet. The valve having a first arrangement wherein the outlet of the valve is in fluid communication with the inlet of the valve and a second arrangement wherein the outlet of the valve is not in fluid communication with the inlet of the valve. The water delivery system further comprising a spout having a fluid conduit positioned therein. The fluid conduit being in fluid communication with the outlet of the valve to receive water from the valve when the valve is in the first arrangement. The water delivery system further comprising an illumination module supported by the spout which includes a grating that directs optical energy into a detection zone in a plurality of spatially spaced apart beams of optical energy and a multi-element sensor which receives optical energy reflected from an object positioned in the detection zone. The received optical energy having a plurality of spatially spaced apart peaks. The water delivery system further comprising a controller which causes the valve to move from the second arrangement to the first arrangement based on the received optical energy.

In one example, the water delivery system further comprises at least one user input coupled to the controller. The at least one user input controlling at least one of a temperature of water communicated from the valve to the fluid conduit of the spout and a flow rate of water communicated from the valve to the fluid conduit of the spout.

In still another exemplary embodiment of the present disclosure, a water delivery system which is coupled to a source of water is provided. The water delivery system comprising a valve including an inlet in fluid communication with the source of water and an outlet. The valve having a first arrangement wherein the outlet of the valve is in fluid communication with the inlet of the valve and a second arrangement wherein the outlet of the valve is not in fluid communication with the inlet of the valve. The water delivery system further comprising a spout having a fluid conduit positioned therein. The fluid conduit being in fluid communication with the outlet of the valve to receive water from the valve when the valve is in the first arrangement. The water delivery system further comprising a proximity sensor supported by the spout, the proximity sensor providing optical energy into a detection zone in a plurality of spatially spaced apart beams of optical energy; a touch sensor supported by the spout; and a controller which causes the valve to move from the second arrangement to the first arrangement based at least one of the proximity sensor and the touch sensor.

In one example, at least a portion of an exterior of the spout is part of the touch sensor. In a variation thereof, the water delivery system further comprises at least one user input coupled to the controller. The at least one user input controlling at least one of a temperature of water communicated from the valve to the fluid conduit of the spout and a flow rate of water communicated from the valve to the fluid conduit of the spout.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which:

FIG. 1 illustrates a faucet supported by a sink deck and including a proximity sensor;

DETAILED DESCRIPTION OF THE DRAWINGS

Figure 1A:
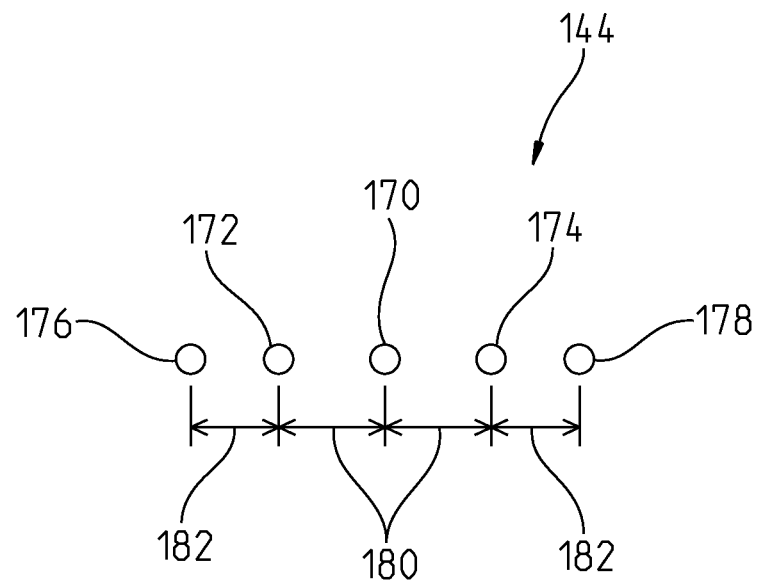
FIG. 1A illustrates a plurality of optical sources emitted by the proximity sensor.

The embodiments of the invention described herein are not intended to be exhaustive or to limit the invention to the precise forms disclosed. Rather, the embodiments elected for description have been chosen to enable one skilled in the art to practice the invention.

Referring to FIG. 1, an exemplary water delivery device 100 is shown. The water delivery device 100 is a faucet 102 having an elongated spout 104. Although a faucet 102 is illustrated other water delivery devices are contemplated, including shower systems; pot fillers; and any other device which controls the provision of water.

Faucet 102 is mounted to a sink deck 106 and a first end 108 of spout 104 is positioned over a sink basin 110. Faucet 102 includes at least one fluid conduit 112 which is in fluid communication with at least one valve 114. The valve 114 is further in fluid communication with a hot water supply 116 through a fluid conduit 118 and a cold water supply 120 through a fluid conduit 122. Valve 114 may be a single valve or a combination of multiple valves.

In one embodiment, valve 114 is an electronic mixing valve which receives water from one or both of hot water supply 116 and cold water supply 120 and provides mixed water to fluid conduit 112. Exemplary electronic mixing valves are disclosed in U.S. patent application Ser. No. 11/737,727, filed Apr. 19, 2007, the disclosure of which is expressly incorporated by reference herein. The temperature and flow rate of the mixed water is specified by a user through one or more user inputs 130. Exemplary user inputs include manual inputs and electronic inputs. Exemplary manual inputs include levers, knobs, and other suitable types of mechanically actuated inputs. Exemplary electronic inputs include slide touch controls, buttons, switches, a touch screen interface, and other suitable types of user inputs which generate an electrical signal in response to at least one of a tactile, audio, or optical input. Exemplary electronic inputs are disclosed in U.S. patent application Ser. No. 11/737,727, filed Apr. 19, 2007, U.S. patent application Ser. No. 12/255,358, filed Oct. 21, 2008, the disclosures of which are expressly incorporated by reference herein.

In one embodiment, valve 114 is an electronic mixing valve including an ON/OFF valve in series or simply an ON/OFF valve. One reason for including an ON/OFF valve is to provide an easy ON/OFF control without requiring a user to set a desired temperature and flow rate with user inputs 130 each time that faucet 102 is to be activated. In this arrangement, the mixing valve regulates temperature and flow and the ON/OFF valve either communicates water to fluid conduit 112 or does not. In one embodiment, valve 114 includes a first valve which regulates the temperature and flow of water from hot water supply 116 and a second valve which regulates the temperature and flow of water from cold water supply 120. The output of these two valves are mixed and provided to fluid conduit 112. In one example, an ON/OFF valve is included in series. In one embodiment, valve 114 may take the form of any of the valve configurations disclosed in any of the patents, published applications, and pending patent applications incorporated by reference herein.

In one embodiment, faucet 102 includes a hands-free mode of operation. In this arrangement, a desired temperature and flow rate are set with valve 114 through user inputs 130. Faucet 102 includes a proximity sensor 140 which monitors a detection zone 142 for an object. Proximity sensor 140 emits a monitoring signal 144 which, in general, is reflected by objects in detection zone 142, such as sink bottom 146 in FIG. 1, and returned towards proximity sensor 140 as a detection signal 148. A controller 150 of faucet 102 controls the operation of valve 114 based on the detection signal 148 received by proximity sensor 140. In one embodiment, controller 150 configures valve 114 in a first configuration wherein water is communicated to fluid conduit 112 when a first object is detected in detection zone 142 and configures valve 114 in a second configuration wherein water is not communicated to fluid conduit 112 when the first object is not detected in detection zone 142. In one embodiment, controller 150 analyzes the detection signal 148 to determine a position of the first object, to determine a confidence level that the first object is not a false object, and to configure valve 114 appropriately. In one embodiment, controller 150 may execute any of the processing sequences disclosed in any of the patents, published applications, and pending patent applications incorporated by reference herein which include as part of the processing sequence the hands-free operation of the faucet.

In the illustrated embodiment, in addition to hands-free operation, faucet 102 also includes a touch sensor 160 which provides the user with simple touch ON and touch OFF control of faucet 102 without having to manipulate user inputs 130. In one embodiment, an exterior 162 of spout 104 forms part of a capacitive touch sensor 160 through which controller 150 is able to provide the user with simple touch ON and touch OFF control of faucet 102 without having to manipulate user inputs 130. In one embodiment, controller 150 may execute any of the processing sequences disclosed in any of the patents, published applications, and pending patent applications incorporated by reference herein which include as part of the processing sequence the operation of the faucet through a capacitive touch sensor, such as including the exterior of the spout as part of the capacitive touch sensor.

Additional exemplary water delivery devices including hands free operation and/or touch sensors include U.S. Pat. Nos. 6,962,168; 7,278,624; 7,472,433; 7,537,195; U.S. patent application Ser. Nos. 11/325,128; 11/326,989; 11/734,499; 11/700,556; 11/590,463; and 11/105,900, the disclosures of which are expressly incorporated by reference herein.

In the illustrated embodiment, spout 104 includes a spray head 162. In one embodiment, spray head 162 provides one of an aerated stream of water and a laminar flow of water. In the illustrated embodiment, spray head 162 includes fluid pathways to produce either a stream of water from fluid outlet 164, a spray of water from fluid outlets 166, or a combination of a stream of water from fluid outlet 164 and a spray of water from fluid outlets 166. In one embodiment, spout 104 supports a diverter valve to provide manual selection of either fluid outlet 164, fluid outlets 166, or both. In one embodiment, controller 150 controls a diverter valve to select either fluid outlet 164 or fluid outlets 166 or both based on an input from user inputs 130. In one example, the diverter valve is positioned below sink deck 106 and fluid conduit 112 is two separate fluid conduits, one in fluid communication with fluid outlet 164 and one in fluid communication with fluid outlets 166. In one example, the diverter valve is positioned within spout 104. In one embodiment, spout 104 includes a pull-out wand portion which may be spaced apart from the remainder of spout 104 while remaining in fluid communication with valve 114. Exemplary diverter valve arrangements and pull-out wands are disclosed in U.S. patent application Ser. No. 11/700,556, filed Jan. 31, 2007, the disclosure of which is expressly incorporated by reference herein.

Referring to FIG. 1A, monitoring signal 144 is illustrated. Monitoring signal 144 includes multiple spatially spaced apart regions of optical energy. These regions correspond to individual beams of optical energy. Illustratively, monitoring signal 144 includes five spatially spaced apart regions of optical energy including a center region 170, a first left side region 172, a first right side region 174, a second left side region 176, and a second right side region 178. Although five regions are shown any number of regions may be implemented. In one embodiment, monitoring signal 144 is continuous temporally. In one embodiment, monitoring signal 144 is pulsed temporally.

As illustrated, first left side region 172 and first right side region 174 are symmetrical about center region 170 and second left side region 176 and second right side region 178 are also symmetrical about center region 170. In one embodiment, the locations of one or more of first left side region 172, first right side region 174, second left side region 176, and second right side region 178 are asymmetrical about center region 170. As illustrated, first left side region 172 and first right side region 174 are spaced apart from center region 170 at a first distance 180 and second left side region 176 and second right side region 178 are spaced apart from first left side region 172 and first right side region 174, respectively, by a second distance 182. In one embodiment, first distance 180 and second distance 182 are generally equal. In one embodiment, first distance 180 and second distance 182 are not generally equal. In one example, second distance 182 is about half the value of first distance 180.

In one embodiment, the relative spacing between regions 170-178 remains generally constant over the distance from first end 108 of spout 104 down to sink bottom 146 of sink basin 110. In one embodiment, the travel distance of monitoring signal 144 to the sink bottom 146 is up to about 20 inches, a divergence angle between center region 170 and each of first left side region 172 and first right side region 174 is about 2 degrees, a divergence angle between center region 170 and each of second left side region 176 and second right side region 178 is about 3 degrees, first distance 180 is about 0.70 (at a distance of about 20 inches from first end 108 of spout 104) and second distance 182 is about 0.34 (at a distance of about 20 inches from first end 108 of spout 104). Regardless of any absolute change in the spacing of regions 170-178 as they travel away from first end 108 of spout 104, the proportional spacing of regions 170-178 remains constant. When the beams corresponding to regions 170-178 encounter a diffuse object in detection zone 142 they are reflected by the object generally as five spatially spaced apart point sources. When viewed by a detector from a given direction the reflection includes five spatially spaced-apart intensity peaks as discussed herein.

In one embodiment, the beams which include regions 170-178 are generated by a plurality of optical sources. Each of the optical sources emits a directional beam of optical energy that defines the respective regions 170-178. Exemplary sources include lasers and light-emitting diodes. As explained below with reference to FIGS. 2-5, in the illustrated embodiment regions 170-178 are generated by a single optical source 168 whose output beam 188 is passed through an optical system 190 which splits the output beam 188 into a plurality of spatially spaced apart beams which include regions 170-178.

Figure 2:
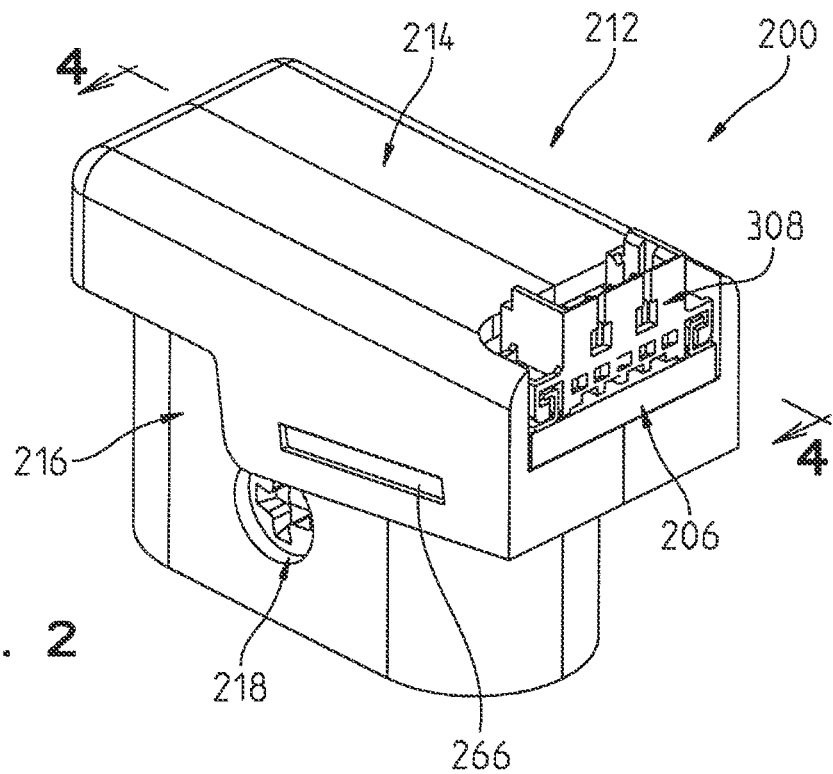
FIG. 2 illustrates an exemplary proximity sensor module.
Figure 3:
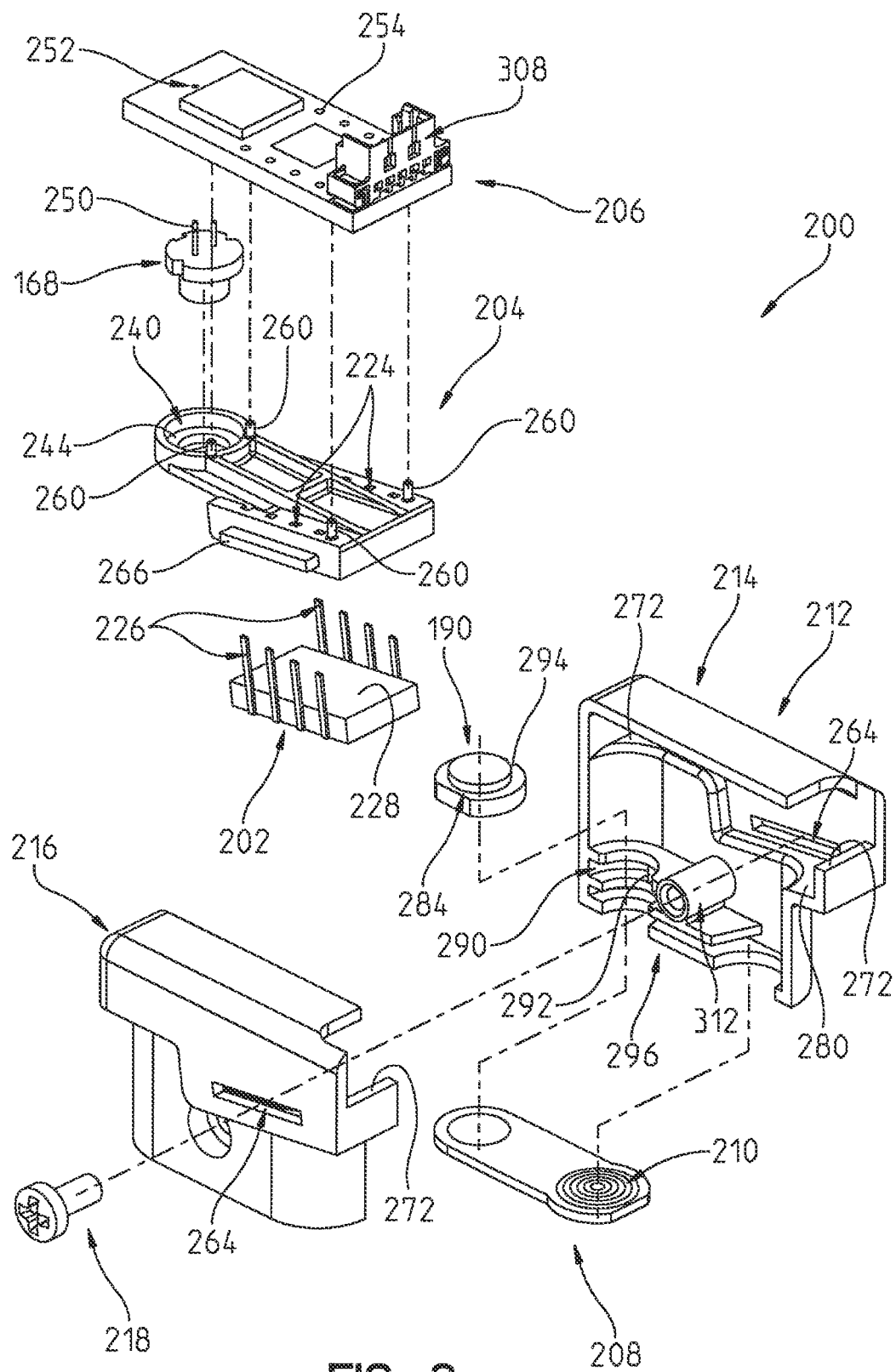
FIG. 3 illustrates an exploded view of the proximity sensor module of FIG. 2.

Referring to FIG. 2, an exemplary proximity sensor module 200 is shown. Referring to FIG. 3, proximity sensor module 200 includes optical source 168, optical system 190, a sensor 202, a holder 204, a controller 206, an optical window 208, an optical system 210, a housing 212 including a first housing member 214 and a second housing member 216, and a coupler 218. Optical source 168 and optical system 190 form one example of an illumination module which provides the plurality of spatially spaced apart regions 170-178.

Figure 4:
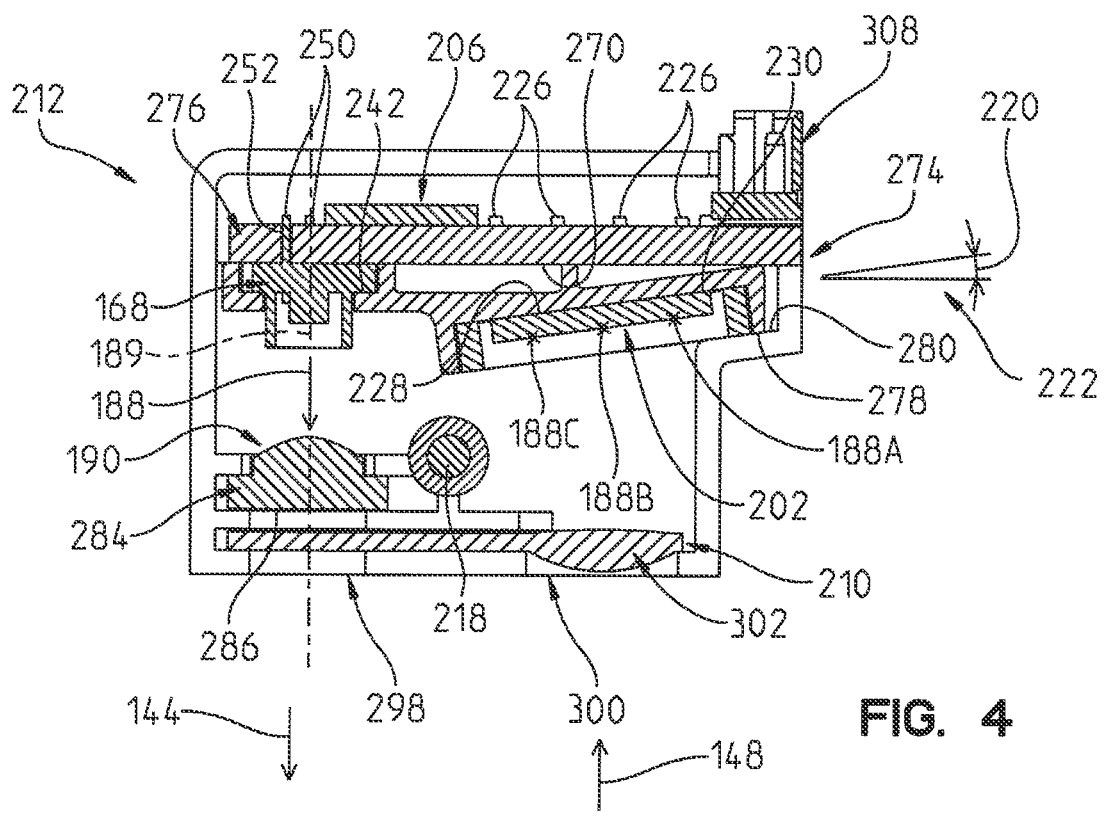
FIG. 4 illustrates a sectional view of the proximity sensor module of FIG. 2 along lines 4-4 in FIG. 2.

Holder 204 holds both optical source 168 and sensor 202 in a manner that optical source 168 and sensor 202 are properly aligned. Referring to FIG. 4, holder 204 holds sensor 202 at an angle 220 relative to a line 222 normal to the direction of output beam 188 of optical source 168. In one embodiment, the value of angle 220 is about 8 degrees. Sensor 202 is angled to increase the range of distances that may be detected and to increase the separation between regions 170-178 on the face of sensor 202. Returning to FIG. 3, holder 204 includes a plurality of openings 224 which extend from a lower side of holder 204 to an upper side of holder 204. Openings 224 receive the prongs 226 of sensor 202 such that a surface 228 of sensor 202 is held flush against a surface 230 of holder 204.

Optical source 168 is received in a recess 240 of holder 204 such that a surface 242 of optical source 168 is flush against a surface 244 of holder 204. An exemplary optical source is a light emitting diode (LED). An exemplary LED is Model No. DL3144008S available from Sanyo.

Figure 4A:
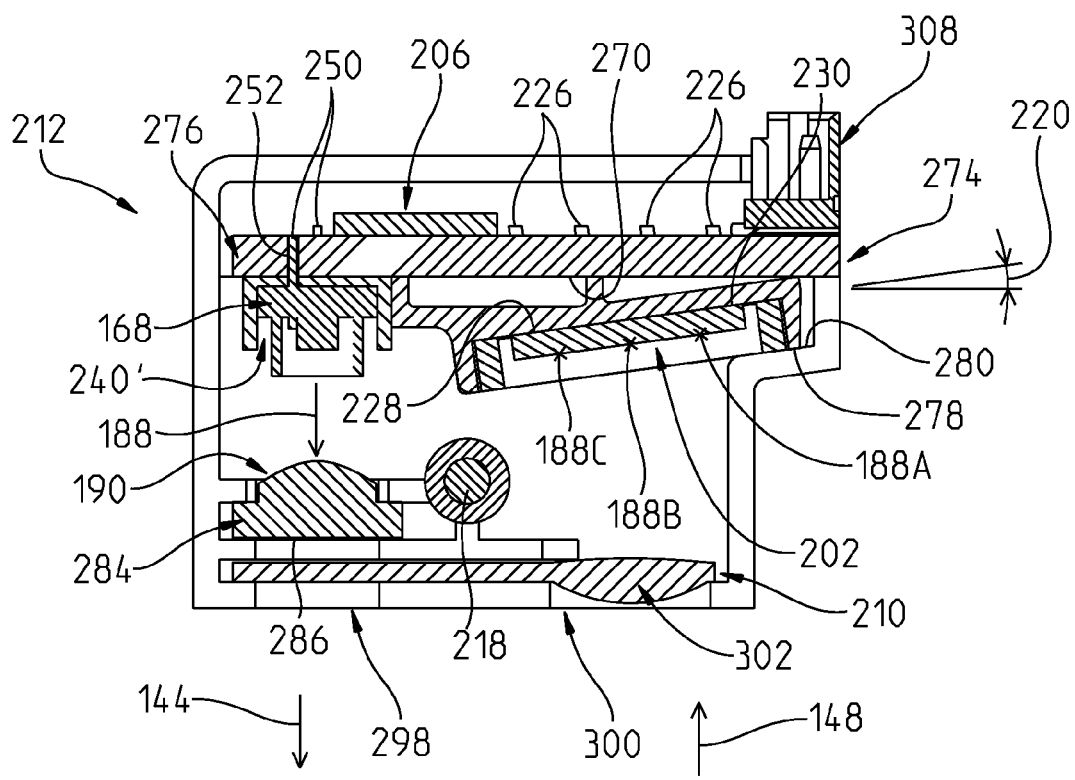
FIG. 4A illustrates a sectional view of an alternative proximity sensor module.

As illustrated in FIG. 4, optical source 168 is lowered into recess 240 from a top side of holder 204 while prongs 226 of sensor 202 are passed through openings 224 from a bottom side of holder 204. In an alternative embodiment, shown in FIG. 4A, optical source 168 is received into a recess 240' from the bottom side of holder 204 just like sensor 202. Regardless of the two configurations of holder 204 shown, optical source 168 and sensor 202 are coupled to controller 206. Exemplary methods of coupling optical source 168 and sensor 202 to controller 206 include soldering and other suitable methods for making the appropriate electrical connections between optical source 168 and controller 206 and between sensor 202 and controller 206. As shown in FIG. 4, both the prongs 250 of optical source 168 and prongs 226 of sensor 202 are received in openings 252 and 254 of controller 206, respectively. Controller 206 is located relative to holder 204 through locator pins 260 extending from the top side of holder 204 which are received in respective recesses in controller 206. In one embodiment, a separation between an optical axis 189 of optical source 168 and a center of sensor 202 indicated by location 148B is about 0.48 inches.

Once optical source 168 and sensor 202 are assembled to controller 206 through holder 204, optical source 168 is aligned relative to sensor 202. This subassembly of optical source 168, sensor 202, holder 204, and controller 206 is assembled relative to first housing member 214 and second housing member 216. Each of first housing member 214 and second housing member 216 include an elongated slot 264 which receives a corresponding tab 266 of holder 204. Referring to FIG. 4, a lower surface 270 of controller 206 is also supported on surface 272 of first housing member 214 and second housing member 216 at both a front end 274 of controller 206 and a rear end 276 of controller 206. In addition, a lower surface 278 of holder 204 is supported by surface 280 of first housing member 214 and second housing member 216.

As mentioned herein, optical system 190 splits output beam 188 include multiple beams or sources, shown in FIG. 1A as regions 170-178. Optical system 190 includes a plano-convex lens having a diffraction grating 286 positioned on the flat side of the lens. In one embodiment, the diffraction grating 286 is a separate component coupled to lens 284. In one embodiment, diffraction grating 286 is formed as part of lens 284. Optical system 190 is captured between first housing member 214 and second housing member 216 by recess 290 in both of first housing member 214 and second housing member 216. Lens 284 includes a key feature 294 which mates with a key feature 292 extending into recess 290 for first housing member 214. In a similar fashion, optical window 208 is captured between first housing member 214 and second housing member 216 by recess 296. Referring to FIG. 4, first housing member 214 and second housing member 216 define an exit window 298 through which light generated by optical source 168 and passed by optical system 190 and optical window 208 exits proximity sensor module 200 and an entrance window 300 through which light reflected from the environment is received and passes through optical system 210 and is incident on sensor 202. As shown in FIG. 4, optical system 210 is a convex lens 302 which focuses the received light onto sensor 202.

In one embodiment, output beam 188 has a visible wavelength. In one embodiment, output beam 188 has an invisible wavelength. In one embodiment, output beam 188 has a wavelength of 785 nm. In one embodiment, optical system 210 includes one or more filters to limit the wavelength band of light reaching sensor 202. In one embodiment, optical window 208 includes an anti-fog coating. In one embodiment, optical window 208 is made an optical polymer. An exemplary optical polymer is E48R ZEONEX brand optical polymer available from Zeon Chemicals L.P. located at 4111 Bells Lane in Louisville, Ky. 40211.

First housing member 214 and second housing member 216 are coupled together through coupler 218. In the illustrated embodiment, coupler 218 is a threaded member which is threaded into a threaded boss 312 of first housing member 214. Other exemplary methods of coupling second housing member 216 to first housing member 214 include mechanical snaps and vibration welding.

Figure 1B:
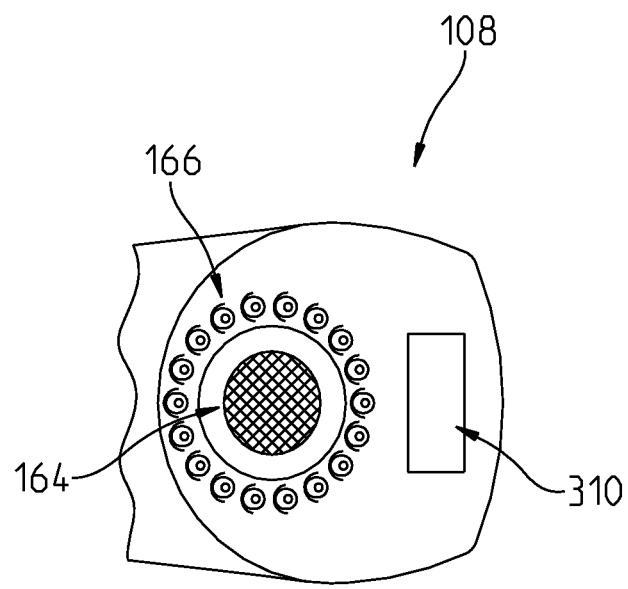
FIG. 1B illustrates a bottom view of the faucet of FIG. 1.

Controller 206 is coupled to controller 150 through one or more electrical wires which are coupled to coupler 308. In one embodiment, controller 206 provides power to optical source 168 and sensor 202, receives the detected illumination pattern 321 (see FIG. 10) from sensor 202, and communicates the detected illumination pattern to controller 150. Referring to FIG. 1B, proximity sensor module 200 is positioned within spout 104 such that exit window 298 and entrance window 300 are aligned with window 310.

Figure 5:
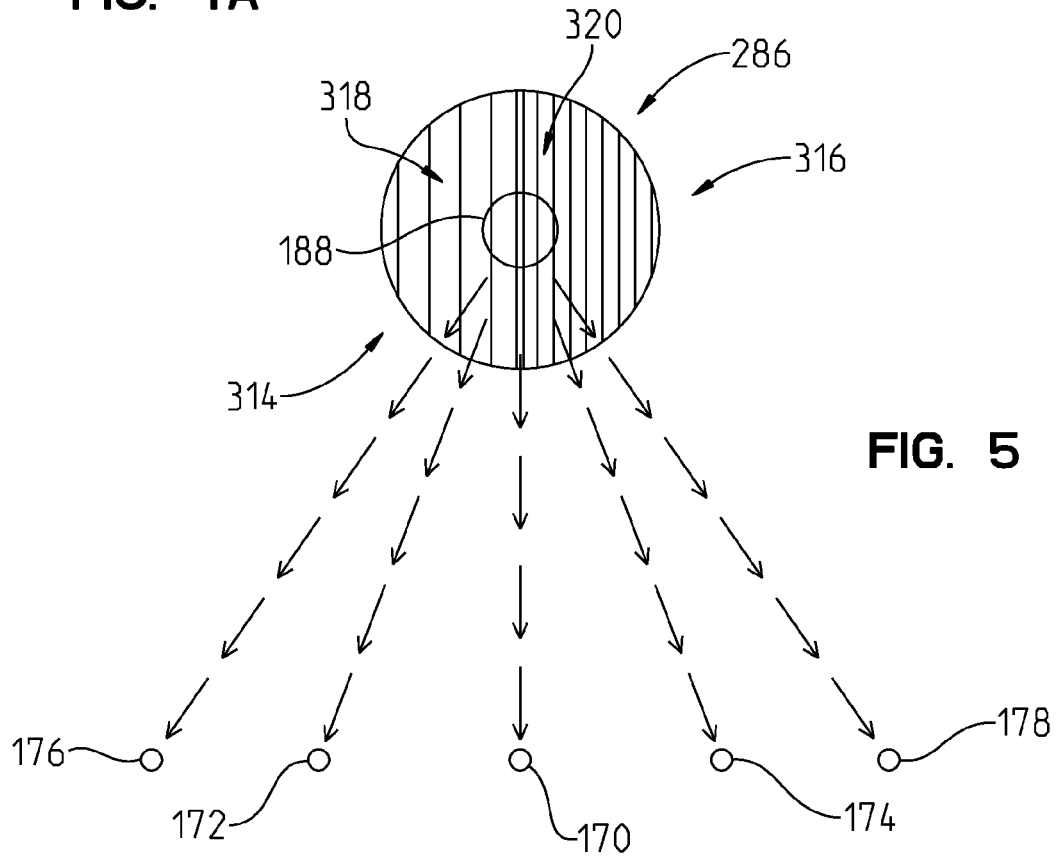
FIG. 5 illustrates an exemplary diffraction grating of the proximity sensor of FIG. 2.

Referring to FIG. 5, an exemplary diffraction grating 286 for optical system 190 is shown. Diffraction grating 286 is divided into two regions, region 314 and region 316. Each of region 314 and region 316 include ridges (ridges 318 and ridges 320, respectively) which causes output beam 188 to diffract into regions 170-178, respectively. In the illustrated embodiment, the frequency of the ridges 318 of region 314 is lower than the frequency of the ridges 320 of region 316. Region 314 diffracts output beam 188 to produce regions 172 and 174. Region 316 diffracts output beam 188 to produce regions 176 and 178. The frequency of region 314 controls the spacing between each of first left side region 172 and first right side region 174 relative to center region 170. The frequency of region 316 controls the spacing between each of second left side region 176 and second right side region 178 relative to center region 170. Both region 314 and region 316 contribute to center region 170. As such, center region 170 has an intensity of about twice of the remaining regions 172-178.

In one embodiment, the frequency of region 314 is about 52 ridges per millimeter with each ridge having a width of about 7.97 um and a height of about 0.675 um. In one embodiment, the frequency of region 314 is about 52 ridges per millimeter with each ridge having a width of about 11.23 um and a height of about 0.675 um. In one embodiment, the frequency of region 316 is about 67 ridges per millimeter with each ridge having a width of about 6.18 um and a height of about 0.675 um. In one embodiment, the frequency of region 316 is about 67 ridges per millimeter with each ridge having a width of about 8.72 um and a height of about 0.675 um.

Figure 10:
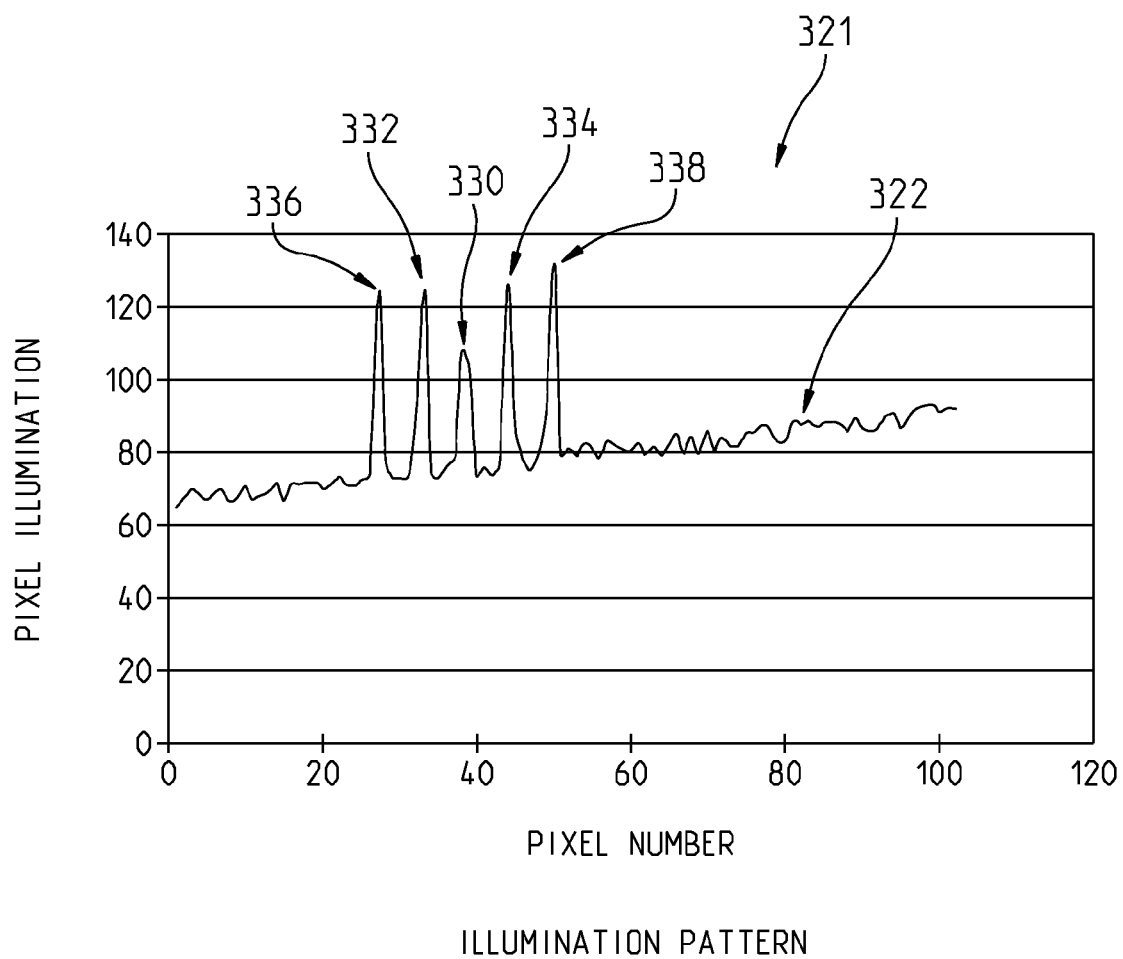
FIG. 10 illustrates an exemplary illumination pattern received by the proximity sensor of FIG. 1.

In operation, detection signal 148 is imaged onto sensor 202. Sensor 202 in the illustrated embodiment is a multi-element sensor having a plurality of individual pixels. In one embodiment, sensor 202 is a CMOS linear image sensor having a single row of pixels. An exemplary CMOS linear image sensor is Model No. S10226, a 1024 pixel sensor, available from Hamamatsu having US offices located at 360 Foothill Road PO Box 6910 in Bridgewater, N.J. 08807-0910. An exemplary illumination pattern 321 received by sensor 202 is shown in FIG. 10. Illumination pattern 321 includes a background component 322 and five intensity peaks 330-338 which correspond to regions 170-178. As explained herein, based on the pixels of sensor 202 which correspond to intensity peaks 330-338, controller 150 is able to estimate a location of an object from first end 108. In one embodiment, the location is a relative location to a baseline position.

Figure 6:
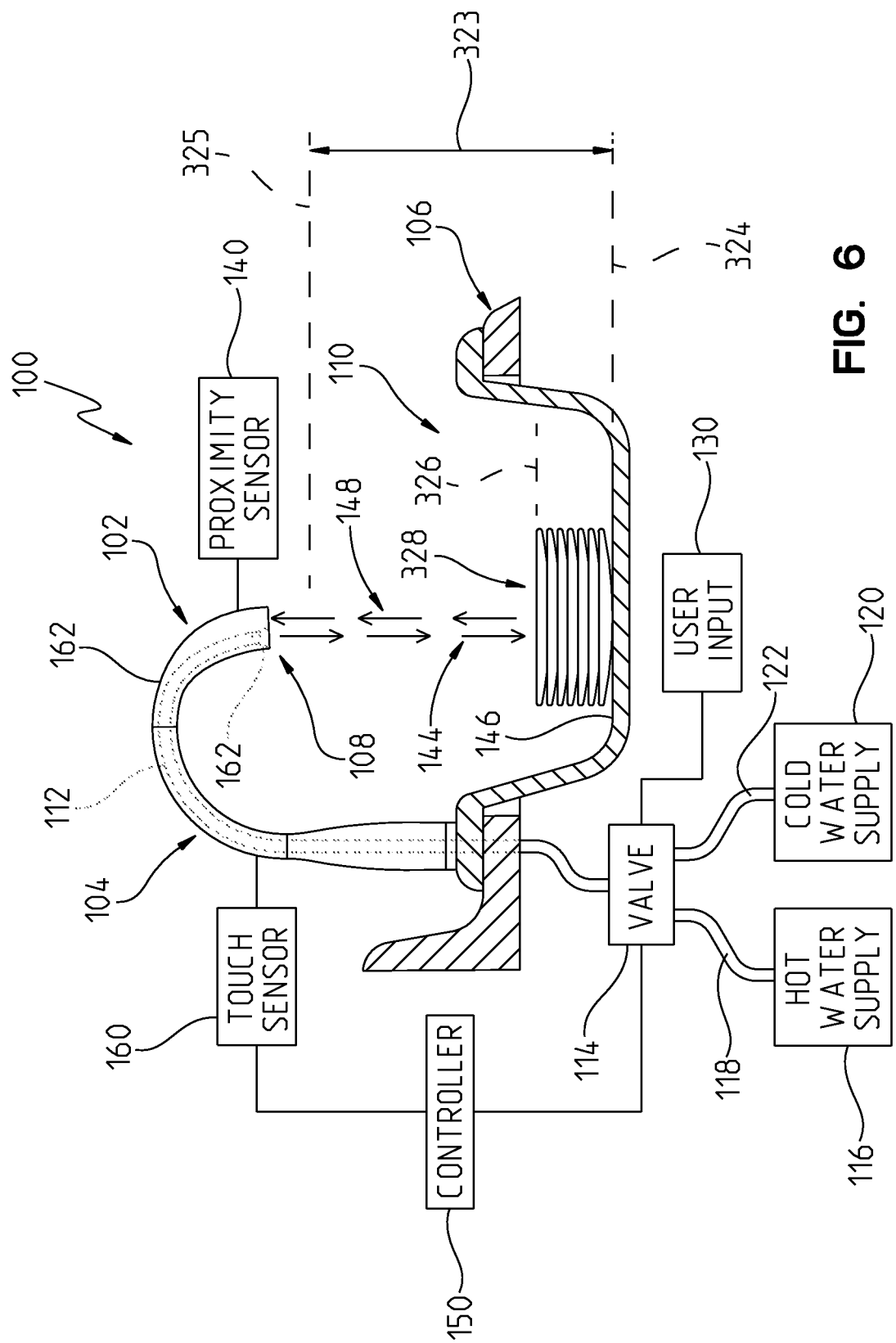
FIG. 6 illustrates the arrangement of FIG. 1 with a plurality of items positioned in the sink basin.
Figure 7:
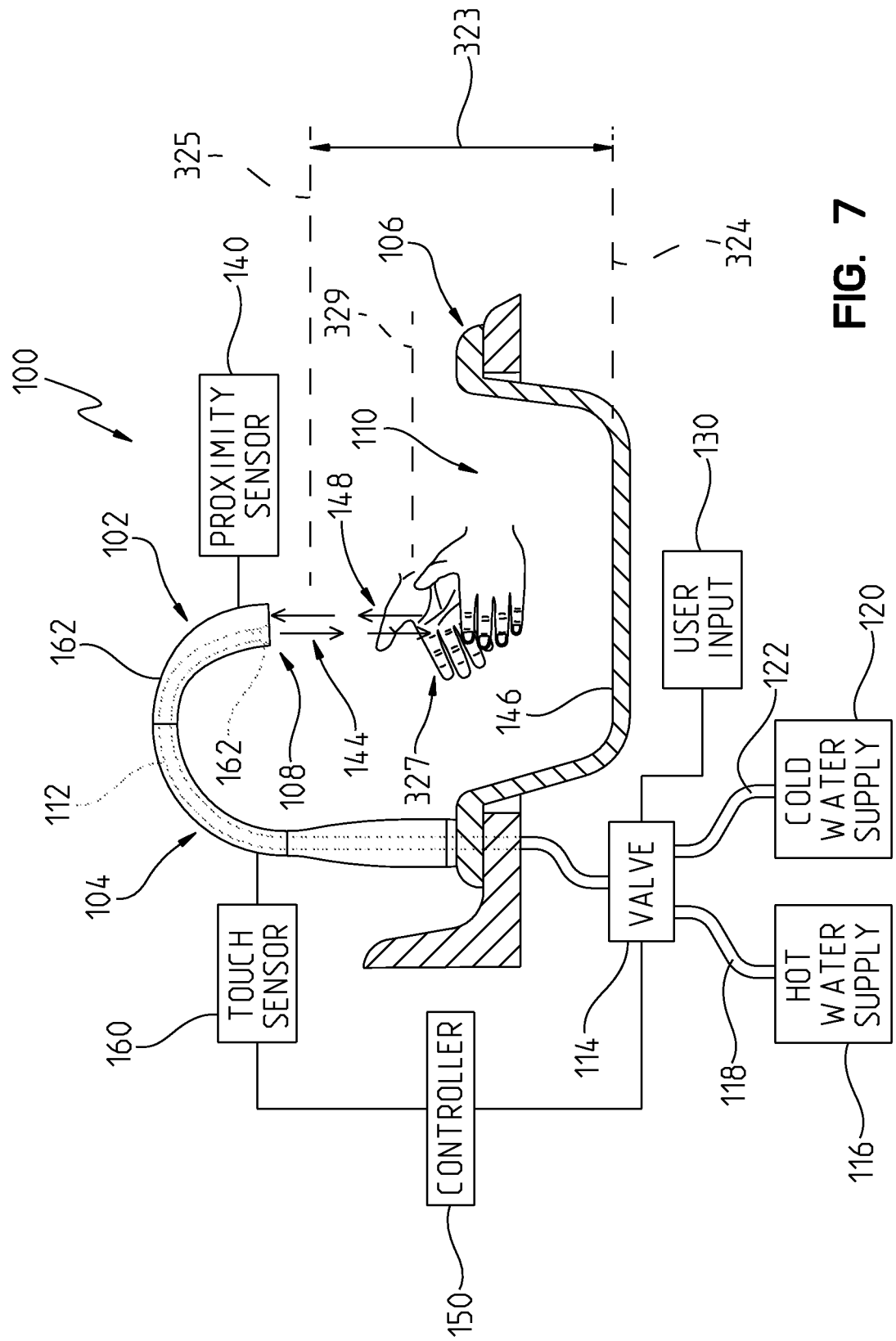
FIG. 7 illustrates the arrangement of FIG. 1 with a user's hands positioned under the faucet.

Referring to FIG. 4, three exemplary locations for detection signal 148 on sensor 202 are shown. Detection signal 148A corresponds to the arrangement of FIG. 1 wherein monitoring signal 144 is reflected from sink bottom 146 of sink basin 110 at a first position 324 from first end 108. Detection signal 148B corresponds to the arrangement of FIG. 6 wherein monitoring signal 144 is reflected from a stack of dishes 328 at a second position 326 from first end 108. Detection signal 148C corresponds to the arrangement of FIG. 7 wherein monitoring signal 144 is reflected from a user's hands 327 at a third position 329. As seen in FIG. 4, the location of detection signal 148 on sensor 202 changes based on the separation between the object reflecting monitoring signal 144 and first end 108. In one embodiment, sensor 202 is able to image detection signal 148 reflected from an object within the zone from first position 324 to a fourth position 325 from first end 108 (see FIG. 6). In the illustrated embodiment, sensor 202 is angled at angle 220 to increase the range 323 between sink bottom 146 and fourth position 325. In one embodiment, range 323 is about 18 inches. In one embodiment, fourth position 325 is about 2 inches below first end 108 of spout 104.

Figure 8:
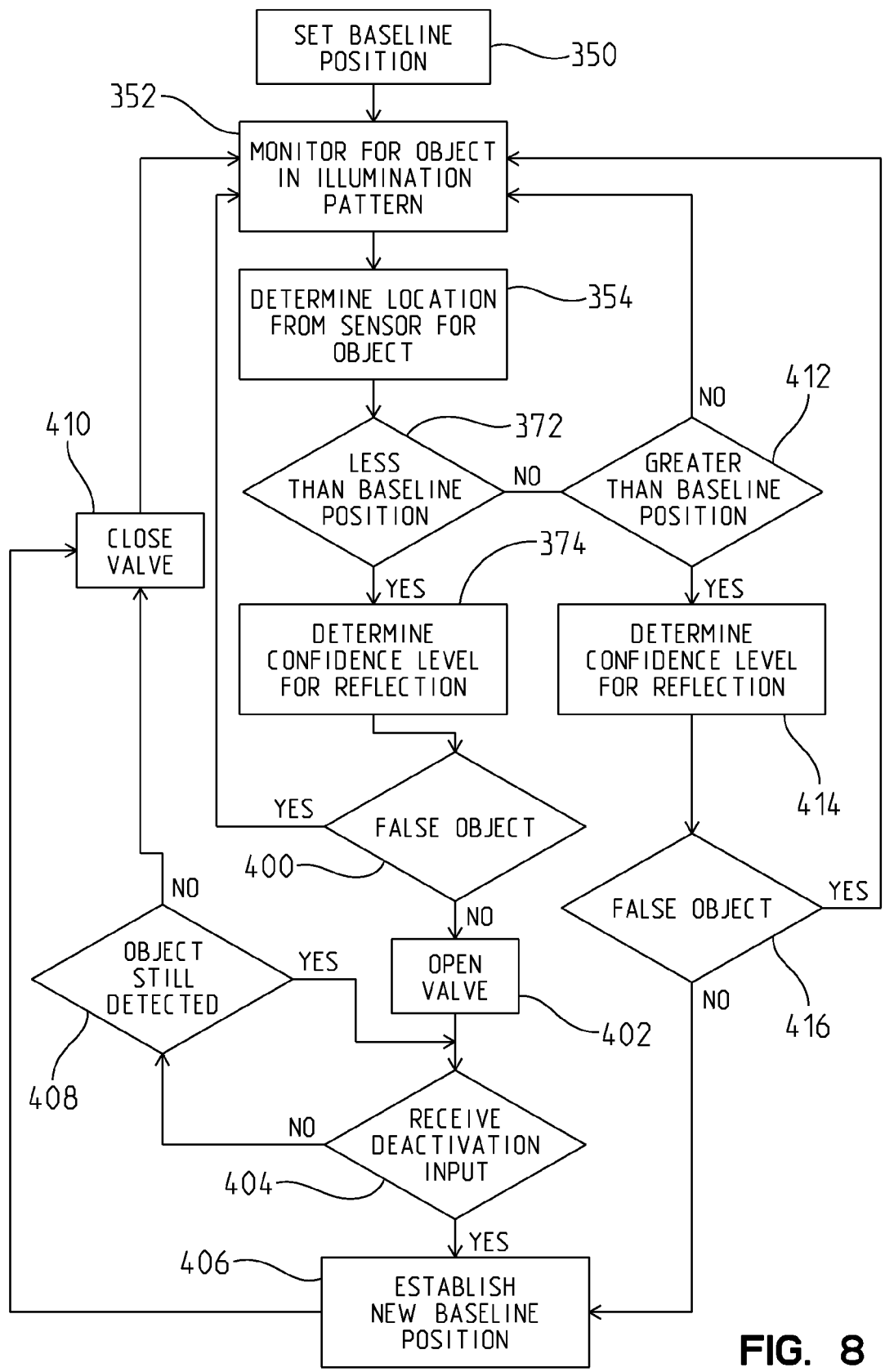
FIG. 8 illustrates an exemplary processing sequence regarding the provision of water with the faucet of FIG. 1.

Referring to FIG. 8, an exemplary operation of water delivery device 100 is represented. In one embodiment, controller 150 executes instructions to control the operation of water delivery device 100. Controller 150 sets a baseline distance to an object, as represented by block 350. In one embodiment, the baseline distance is first position 324. In one example, controller 150 upon power on of proximity sensor module 200 takes the first location of output beam 188 as corresponding to the baseline distance. As mentioned herein, for objects closer to first end 108 of spout 104 than first position 324, the location of detection signal 148 on sensor 202 shifts. As such, controller 150 is able to easily determine if an object is closer to first end 108 of spout 104 that first position 324 or further away, based on the location of detection signal 148 on sensor 202.

Figure 9:
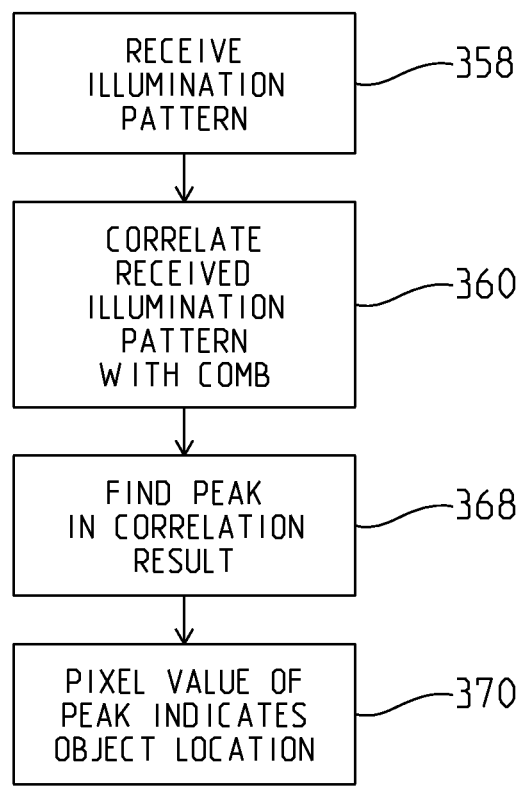
FIG. 9 illustrates an exemplary processing sequence regarding a determination of a position of an object detected by the proximity sensor of the faucet of FIG. 1.
Figure 11:
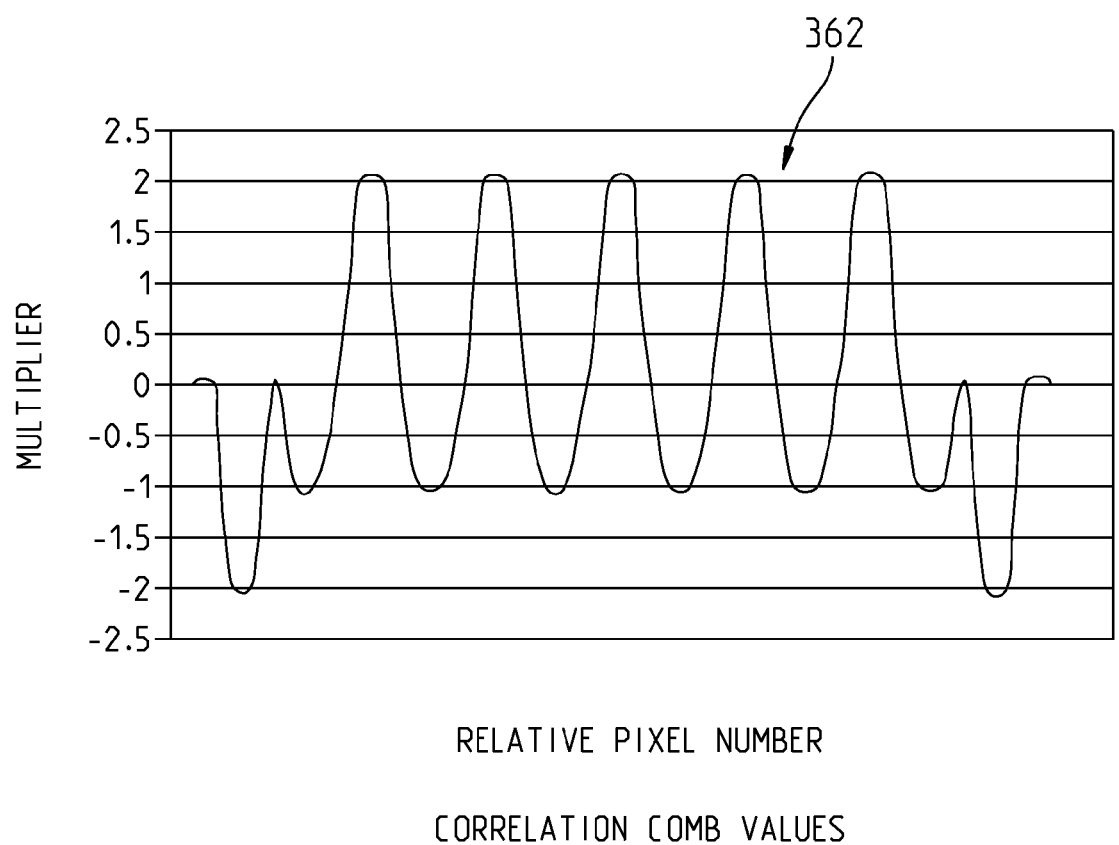
FIG. 11 illustrates an exemplary comb function.

Controller 150 monitors illumination pattern 321 for the presence of an object in illumination pattern 321 other than at the baseline distance, as represented by block 352. As mentioned herein, for objects closer to first end 108 of spout 104 than first position 324, the location of detection signal 148 on sensor 202 shifts. As such, controller 150 is able to easily determine if an object is closer to first end 108 of spout 104 that first position 324 or further away, based on the location of detection signal 148 on sensor 202. Controller 150 determines the location corresponding to the object, as represented by block 354. Referring to FIG. 9, an exemplary processing sequence to determine the location corresponding to an object is provided. Controller 150 receives the illumination pattern 321 from sensor 202, as represented by block 358. Controller 150 correlates the received illumination pattern 321 with a comb function, as represented by block 360. An exemplary comb function 362 is shown in FIG. 11. The comb function 362 has five main peaks to generally match the expected reflection of monitoring signal 144 by a real object in detection zone 142. In one embodiment, the five peaks are spaced to match the spacing of regions 170-178. In addition, if the pixel values of the comb function 362 are summed the result is zero. As such, if the comb function 362 is applied to a uniform background the resultant correlation is zero at each location. Further, the comb function is symmetrical which also results in a zero correlation value when applied to a uniformly rising background level.

Figure 12:
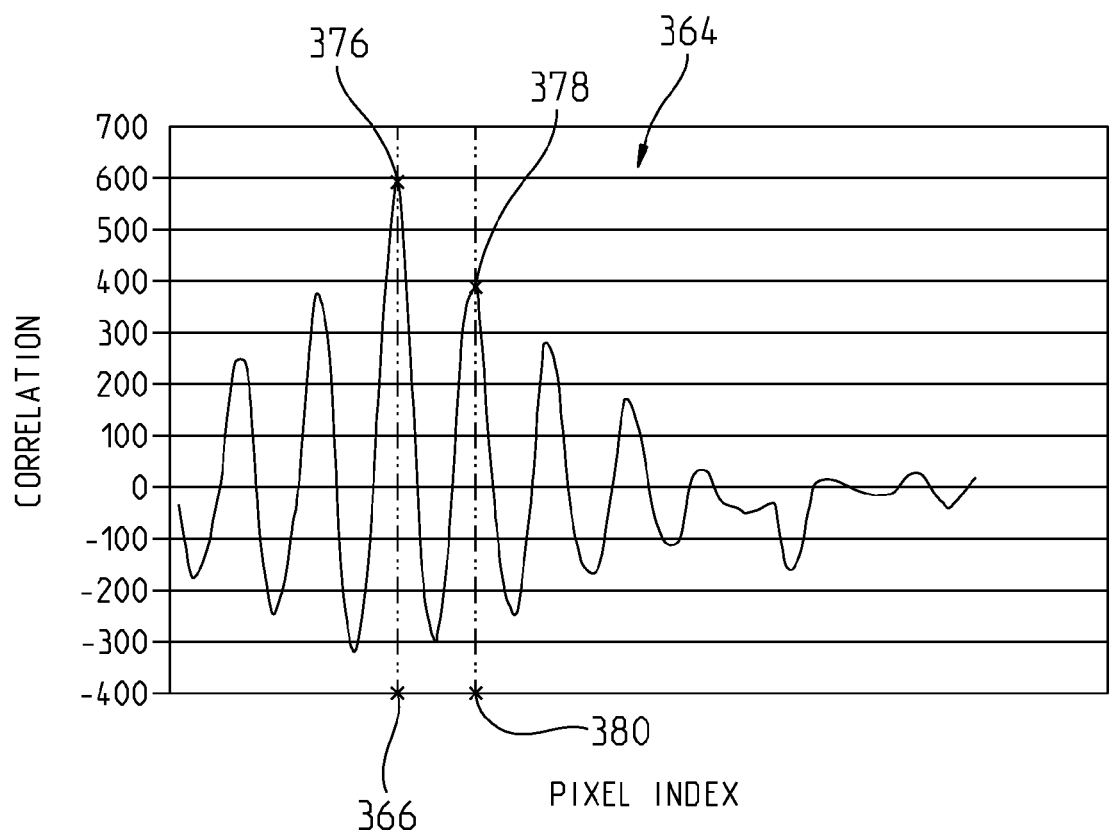
FIG. 12 illustrates an exemplary result of a correlation of the exemplary illumination patter of FIG. 10 and the exemplary comb function of FIG. 11.

The correlation of the illumination pattern 321 shown in FIG. 10 and the comb function 362 shown in FIG. 11 results in the curve 364 shown in FIG. 12. Controller 150 selects the pixel 366 associated with the peak of curve 364 as the pixel corresponding to the location of the object, as represented by blocks 368 and 370. Based on the location of pixel 366 relative to the pixel in the array corresponding to the baseline position, controller 150 may decide the relative position of the object (closer than the baseline position or further away than the baseline position). The actual distance between first end 108 and the object may be readily calculated based on the shift in pixels, a knowledge of the distance corresponding to a given shift, and a known distance (such as sink bottom 146).

Returning to FIG. 8, controller 150 checks to see if the location corresponding to the detected object is less than the current baseline position, as represented by block 372. If yes, then controller 150 determines a confidence level for the received output beam 188, as represented by block 374.

Figure 13:
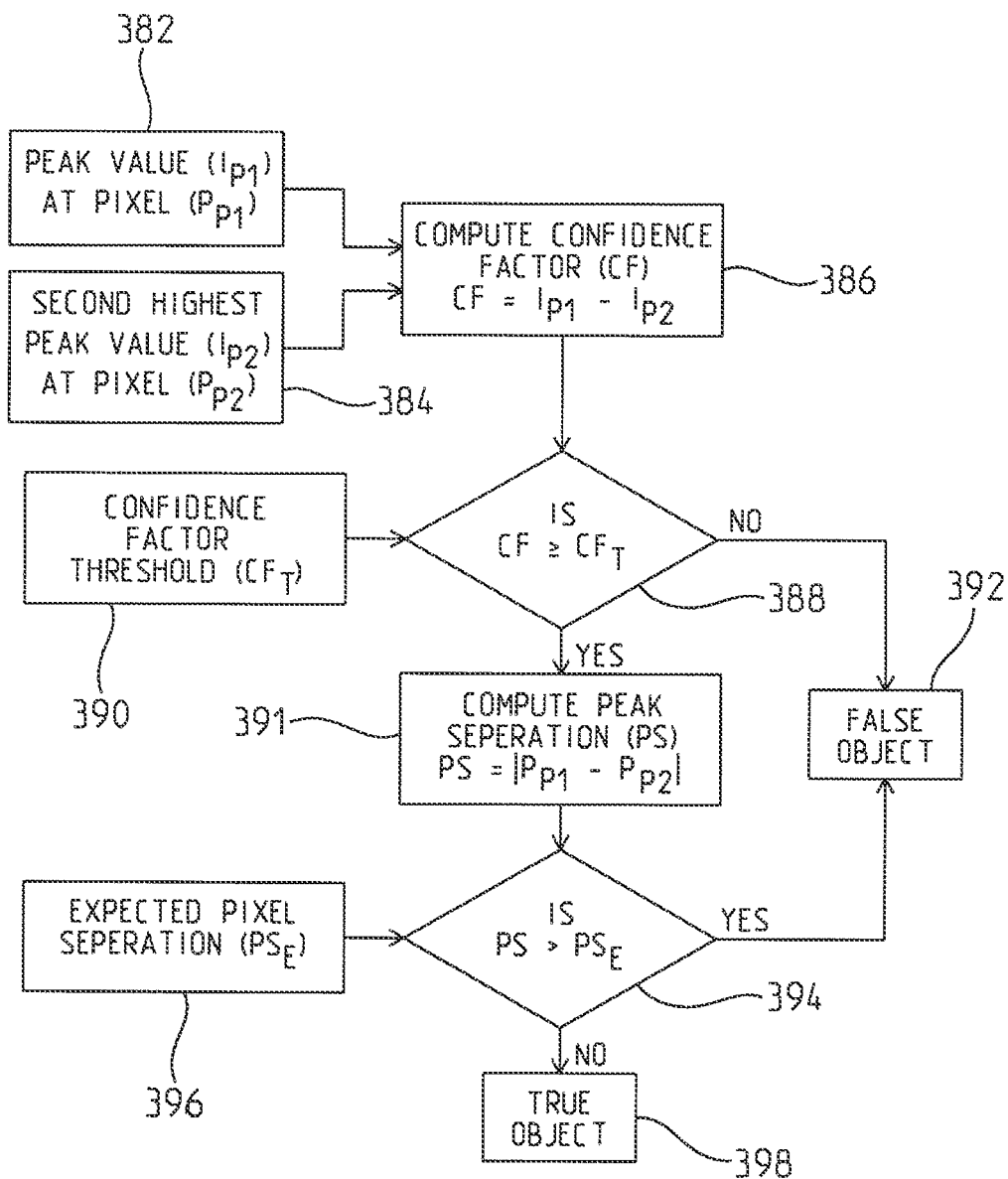
FIG. 13 illustrates an exemplary processing sequence regarding a determination of a confidence level of the object detected by the proximity sensor of the faucet of FIG. 1.

Referring to FIG. 13, an exemplary method of determining a confidence level is provided. Controller 150 determines the intensity value 376 for pixel 366 (highest peak value) and the intensity value 378 for pixel 380 (second highest peak value), as represented by blocks 382 and 384. Controller 150 determines the difference between intensity value 376 and intensity value 378, as represented by block 386. This difference provides a measure of how well the illumination pattern 321 matches the comb function 326. This difference is compared to a threshold value, as represented by blocks 388 and 390. If the difference is not at least equal to the threshold value, the object is classified as a false object, as represented by block 392. As such, a confidence level is classified as FALSE. If the difference is at least equal to the threshold value, then the object may qualify as a true or real object. As such, a confidence level is classified as TRUE.

In one embodiment, further processing is performed before the object is classified as a real object. Controller 150 determines the separation between pixel 366 and pixel 380, as represented by block 390. This separation is compared to a threshold value, as represented by blocks 394 and 396. If the separation is greater than the threshold value, the object is classified as a false object, as represented by block 392. If the separation is less than or equal to the threshold value, then the object is classified as a true or real object, as represented by block 398.

In one embodiment, controller 150 requires at least two intensity peaks of peaks 330-338 be present in illumination pattern 321 as a threshold for an object being eligible to be classified as TRUE. In one embodiment, controller 150 requires at least three intensity peaks of peaks 330-338 be present in illumination pattern 321 as a threshold for an object being eligible to be classified as TRUE. In one embodiment, controller 150 requires at least four intensity peaks of peaks 330-338 be present in illumination pattern 321 as a threshold for an object being eligible to be classified as TRUE. In one embodiment, controller 150 requires all of peaks 330-338 be present in illumination pattern 321 as a threshold for an object being eligible to be classified as TRUE.

Returning to FIG. 8, controller 150 checks whether the object is a false object or not, as represented by block 400. If the object is a false object, controller 150 continues to monitor for another object, as represented by block 352. In one embodiment, controller 150 analyzes the illumination pattern 321 of sensor 202 about 8 times a second. If the object is classified as a true object, controller 150 opens valve 114 such that water exits first end 108 of spout 104, as represented by block 402.

While valve 114 is open, controller 150 checks to see if it has received a deactivation input, as represented by block 404. An exemplary deactivation input would be a tap on spout 104 when spout 104 is part of touch sensor 160. Another exemplary deactivation input would be through user inputs 130. If a deactivation input has not been received, controller 150 continues to evaluate if the object is still being detected, as represented by block 408. If the object is no longer being detected then controller 150 closes valve 114, as represented by block 410, and returns to block 352. If the object is still being detected or another object is being detected, controller 150 returns to block 404 and continues to loop. This scenario is representative of a hands-free mode, such as washing hands 327 in FIG. 7. As hands 327 are placed in the path of monitoring signal 144, sensor 202 registers an illumination pattern 321 which indicates an object at third position 329. The user continues to wash hands 327 and then removes hands 327. Controller 150 then again detects sink bottom 146 as the object and closes valve 114. In one embodiment, controller 150 has a timeout feature wherein water continues to flow for a preset time after hands 327 are removed. If hands 327 are again introduced into the path of monitoring signal 144 before expiration of the timeout period then valve 114 will remain open and the timeout period will reset.

Returning to FIG. 8, if a deactivation input has been received, controller 150 establishes a new baseline level, as represented by block 406, and closes valve 114, as represented by block 410. This scenario is representative of when a user has placed something in the sink basin 110, but does not want the water to stay on continuously, such as the dishes 328 in FIG. 6. As dishes 328 are placed in sink basin 110 the user may desire for the water to stay on initially, but subsequently have the water turn off to allow the dishes time to soak. Proximity sensor module 200 will still be detecting dishes 328 at a second position 326, so after the deactivation input is received controller 150 would reopen valve 114 if the current baseline position was still being used. As such, controller 150 updates the baseline position to correspond to second position 326. Now, controller 150 will not reopen valve 114 unless there is an object detected at a location other than the new baseline position which corresponds to second position 326 (or it receives an input from either user inputs 130 or touch sensor 160).

Up to this point in FIG. 8, the discussion has been around objects which are detected at positions less than the current baseline position. However, it is also possible to detect objects at positions greater than the current baseline position, as represented by block 412. This scenario may correspond to the removal of dishes 328 from sink basin 110. At that point, proximity sensor module 200 would once again be detecting sink bottom 146 of sink basin 110. Controller 150 once again determines a confidence level for the reflection, as represented by block 414. If the detected object is found to be a true object then the baseline position is established at sink bottom 146 again, as represented by blocks 416 and 406.

Although the invention has been described in detail with reference to certain preferred embodiments, variations and modifications exist within the spirit and scope of the invention as described and defined in the following claims.

What is claimed is:

1. A proximity sensor for sensing the presence of an object in an environment, the proximity sensor comprising:
an illumination module which emits optical energy that is propagated into the environment in a plurality of spatially spaced apart beams of optical energy;
a multi-element sensor which receives a portion of the emitted optical energy which is reflected back from the environment having a plurality of spatially spaced apart peaks;
a holder which aligns the multi-element sensor relative to at least a first portion of the illumination module, the holder having a first portion which holds the first portion of the illumination module in a first position and a second portion which holds the multi-element sensor in a second position spaced apart from the first position, a face of the multi-element sensor being angled relative to a plane which is normal to an optical axis of the illumination module;
a controller coupled to the illumination module and the multi-element sensor, the controller determining the presence of an object in the environment based on at least one of a spacing between at least two of the plurality of spatially spaced apart peaks of the received optical energy and a difference in intensity between at least two of the plurality of spatially spaced apart peaks of the received optical energy; and
a housing which supports the illumination module, the multi-element sensor, and the holder.

2. The proximity sensor of claim 1, wherein a second portion of the illumination module is spaced apart from the holder.

3. The proximity sensor of claim 1, wherein the first portion of the illumination module includes a first optical source which emits optical energy in a first direction along the optical axis of the illumination module and which is supported by the holder and the second portion of the illumination module includes an optical system which splits the optical energy emitted by the first optical source in the first direction into the plurality of spatially spaced apart beams of optical energy.

4. The proximity sensor of claim 3, wherein the optical system includes a diffraction grating which splits the optical energy emitted by the first optical source in the first direction along the optical axis of the illumination module into the plurality of spatially spaced apart beams of optical energy.

5. The proximity sensor of claim 4, wherein the diffraction grating includes a plurality of regions having distinct grating frequencies, including a first region having a first grating frequency which splits the optical energy emitted by the first optical source in the first direction along the optical axis of the illumination module into a first beam which propagates in the first direction along the optical axis of the illumination module and at least two additional beams spaced apart from the first beam and a second region having a second grating frequency which splits the optical energy emitted by the first optical source in the first direction along the optical axis of the illumination module into the first beam which propagates in the first direction along the optical axis of the illumination module and at least two additional beams spaced apart from the first beam and spaced apart from the at least two additional beams corresponding to the first grating frequency.

6. The proximity sensor of claim 4, wherein the optical system includes a lens positioned between the first optical source and the diffraction grating.

7. The proximity sensor of claim 1, wherein the plurality of spatially spaced apart beams of optical energy are an odd number and a central beam of the plurality of discrete beams has an intensity of about twice the remainder of the plurality of spatially spaced apart beams of optical energy.

8. The proximity sensor of claim 7, wherein the central beam of the plurality of spatially spaced apart beams of optical energy propagates generally in a first direction along the optical axis of the illumination module.

9. The proximity sensor of claim 1, wherein the first portion of the holder includes a first alignment surface with contacts the first portion of the illumination module and the second portion of the holder includes a second alignment surface which contacts the multi-element sensor, the second alignment surface being angled relative to the first alignment surface.

10. The proximity sensor of claim 1, wherein the illumination module includes a first plurality of prongs which couple the illumination module to the controller and the multi-element sensor includes a second plurality of prongs which couple the multi-element sensor to the controller, wherein the illumination module and the multi-element sensor are positioned on a first side of the holder and the controller is positioned on a second side of the holder, the first plurality of prongs and the second plurality of prongs extending through the holder.

11. A proximity sensor for sensing the presence of an object in an environment, the proximity sensor comprising:
- a housing having a first plurality of alignment features;
- a holder having a second plurality of alignment features which cooperate with the first plurality of alignment features to secure the holder to the housing;
- an optical source positioned on a first side of the holder;
- a multi-element sensor positioned on the first side of the holder and spaced apart from the optical source;
- a controller positioned on a second side of the holder opposite of the first side, the controller being coupled to the optical source and the multi-element sensor through the holder;
- a first optical system supported by the housing and aligned with the optical source; and
- a second optical system supported by the housing and aligned with the multi-element sensor, the first optical system being spaced apart from the optical source and the second optical system being spaced apart from the first optical system and from the multi-element sensor;
- wherein the first optical system splits the optical energy emitted by the optical source into a plurality of spatially spaced apart beams of optical energy, the multi-element sensor receives a portion of the emitted optical energy which is reflected back from the environment having a plurality of spatially spaced apart peaks, and the controller determines the presence of an object in the environment based on at least one of a spacing between at least two of the plurality of spatially spaced apart peaks of the received optical energy and a difference in intensity between at least two of the plurality of spaced apart peaks of the received optical energy.

12. The proximity sensor of claim 11, wherein the housing includes an exit window through which optical energy emitted by the optical source that passes through the first optical system exits the housing and an entrance window through which optical energy reflected by the object enters the housing and passes through the second optical system and onto the multi-element sensor.

13. The proximity sensor of claim 11, wherein the first optical system includes a lens and a diffraction grating and the second optical system includes a lens, the housing including a first recess which receives the first optical system and a second recess spaced apart from the first recess which receives the second optical system.

14. The proximity sensor of claim 13, wherein the housing orients the diffraction grating such that the plurality of spatially spaced apart beams of optical energy are incident on the multi-element sensor when reflected by the object in the environment.

15. The proximity sensor of claim 11, wherein the second recess supports an optical window for the exit window.

16. The proximity sensor of claim 11, wherein at least one of the first optical system and the second optical system includes an anti-fog coating.

17. A proximity sensor for sensing the presence of an object in an environment, the proximity sensor comprising:
- an illumination module which emits optical energy that is propagated into the environment in a plurality of spatially spaced apart beams of optical energy, the illumination module including a first optical source and a diffraction grating which splits optical energy from the first optical source into the plurality of spatially spaced apart beams of optical energy;
- a multi-element sensor which receives a portion of the emitted optical energy which is reflected back from the environment, the received portion having a plurality of spaced apart peaks;
- a controller coupled to the illumination module and the multi-element sensor, the controller determining the presence of an object in the environment based on at least one of a spacing between at least two of the plurality of spatially spaced apart peaks of the received optical energy and a difference in intensity between at least two of the plurality of spatially spaced apart peaks of the received optical energy; and
- a housing which supports the illumination module, the multi-element sensor, and the holder.

18. The proximity sensor of claim 17, further comprising a holder which aligns the multi-element sensor relative to at least a first portion of the illumination module.

19. The proximity sensor of claim 18, wherein the holder includes a first portion which holds the first portion of the illumination module in a first position and a second portion which holds the multi-element sensor in a second position spaced apart from the first position, a face of the multi-element sensor being angled relative to a plane which is normal to an optical axis of the illumination module.

20. The proximity sensor of claim 1, wherein the controller further determines the spacing between at least two of the plurality of spatially spaced apart peaks of the received optical energy and the difference in intensity between at least two of the plurality of spaced apart peaks of the received optical energy.

21. The proximity sensor of claim 11, wherein the controller further determines the spacing between at least two of the plurality of spatially spaced apart peaks of the received optical energy and the difference in intensity between at least two of the plurality of spaced apart peaks of the received optical energy.

22. The proximity sensor of claim 17, wherein the controller further determines the spacing between at least two of the plurality of spatially spaced apart peaks of the received optical energy and the difference in intensity between at least two of the plurality of spaced apart peaks of the received optical energy.

* * * * *